(12) United States Patent
Chen

(10) Patent No.: US 10,777,527 B1
(45) Date of Patent: Sep. 15, 2020

(54) METHOD FOR TRANSFERRING MICRO DEVICE

(71) Applicant: MIKRO MESA TECHNOLOGY CO., LTD., Apia (WS)

(72) Inventor: Li-Yi Chen, Tainan (TW)

(73) Assignee: MIKRO MESA TECHNOLOGY CO., LTD., Apia (WS)

( * ) Notice: Subject to any disclaimer, the term of this patent is extended or adjusted under 35 U.S.C. 154(b) by 0 days.

(21) Appl. No.: 16/507,060

(22) Filed: Jul. 10, 2019

(51) Int. Cl.
*H01L 23/00* (2006.01)
*H01L 21/683* (2006.01)
*H01L 33/62* (2010.01)
*H01L 25/075* (2006.01)

(52) U.S. Cl.
CPC .......... *H01L 24/80* (2013.01); *H01L 21/6835* (2013.01); *H01L 25/0753* (2013.01); *H01L 33/62* (2013.01); *H01L 2221/68363* (2013.01); *H01L 2224/80006* (2013.01); *H01L 2224/80825* (2013.01); *H01L 2933/0066* (2013.01)

(58) Field of Classification Search
CPC ..... H01L 24/80; H01L 33/62; H01L 25/0753; H01L 21/6835; H01L 2224/80006; H01L 2933/0066; H01L 2224/80825; H01L 2221/68363
See application file for complete search history.

(56) References Cited

U.S. PATENT DOCUMENTS

| 10,141,475 | B1 * | 11/2018 | Chen | H01L 33/62 |
| 2015/0179605 | A1 * | 6/2015 | Dubey | H01L 24/33 257/777 |
| 2018/0269234 | A1 * | 9/2018 | Hughes | H01L 27/156 |

\* cited by examiner

*Primary Examiner* — Ahmed N Sefer
(74) *Attorney, Agent, or Firm* — CKC & Partners Co., LLC

(57) ABSTRACT

A method for transferring a micro device is provided. The method includes: preparing a transfer plate with the micro device thereon in which the micro device is in contact with a picked-up surface of the transfer plate; forming a structure including the micro device, a contact pad of a receiving substrate, and some water therebetween in which two opposite surfaces of the water are respectively in contact with the micro device and a bound surface of the contact pad, and a hydrophilicity of the bound surface of the contact pad facing the transfer plate is greater than a hydrophilicity of the picked-up surface of the transfer plate facing the receiving substrate; and evaporating the water such that the micro device is bound to and in contact with the contact pad.

15 Claims, 12 Drawing Sheets

METHOD FOR TRANSFERRING MICRO DEVICE

BACKGROUND

Field of Invention

The present disclosure relates to a method for transferring a micro device.

Description of Related Art

The statements in this section merely provide background information related to the present disclosure and do not necessarily constitute prior art.

Traditional technologies for transferring of devices include transferring from a transfer wafer to a receiving substrate by wafer bonding. One such implementation is "direct bonding" involving one bonding stage of an array of devices from a transfer wafer to a receiving substrate, followed by removal of the transfer wafer. Another such implementation is "indirect bonding" which involves two bonding/de-bonding stages. In indirect bonding, a transfer head may pick up an array of devices from a donor substrate, and then bond the array of devices to a receiving substrate, followed by removal of the transfer head.

In recent years, many researchers and experts try to overcome difficulties in making a massive transfer of devices (i.e., transferring millions or tens of millions of devices) possible for commercial applications. Among those difficulties, cost reduction, time efficiency, and yield are three of the important issues.

SUMMARY

According to some embodiments of the present disclosure, a method for transferring a micro device is provided. The method includes: preparing a transfer plate with the micro device thereon in which the micro device is in contact with a picked-up surface of the transfer plate; forming a structure including the micro device, a contact pad of a receiving substrate, and some water therebetween in which two opposite surfaces of the water are respectively in contact with the micro device and a bound surface of the contact pad, and a hydrophilicity of the bound surface of the contact pad facing the transfer plate is greater than a hydrophilicity of the picked-up surface of the transfer plate facing the receiving substrate; and evaporating the water such that the micro device is bound to and in contact with the contact pad.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
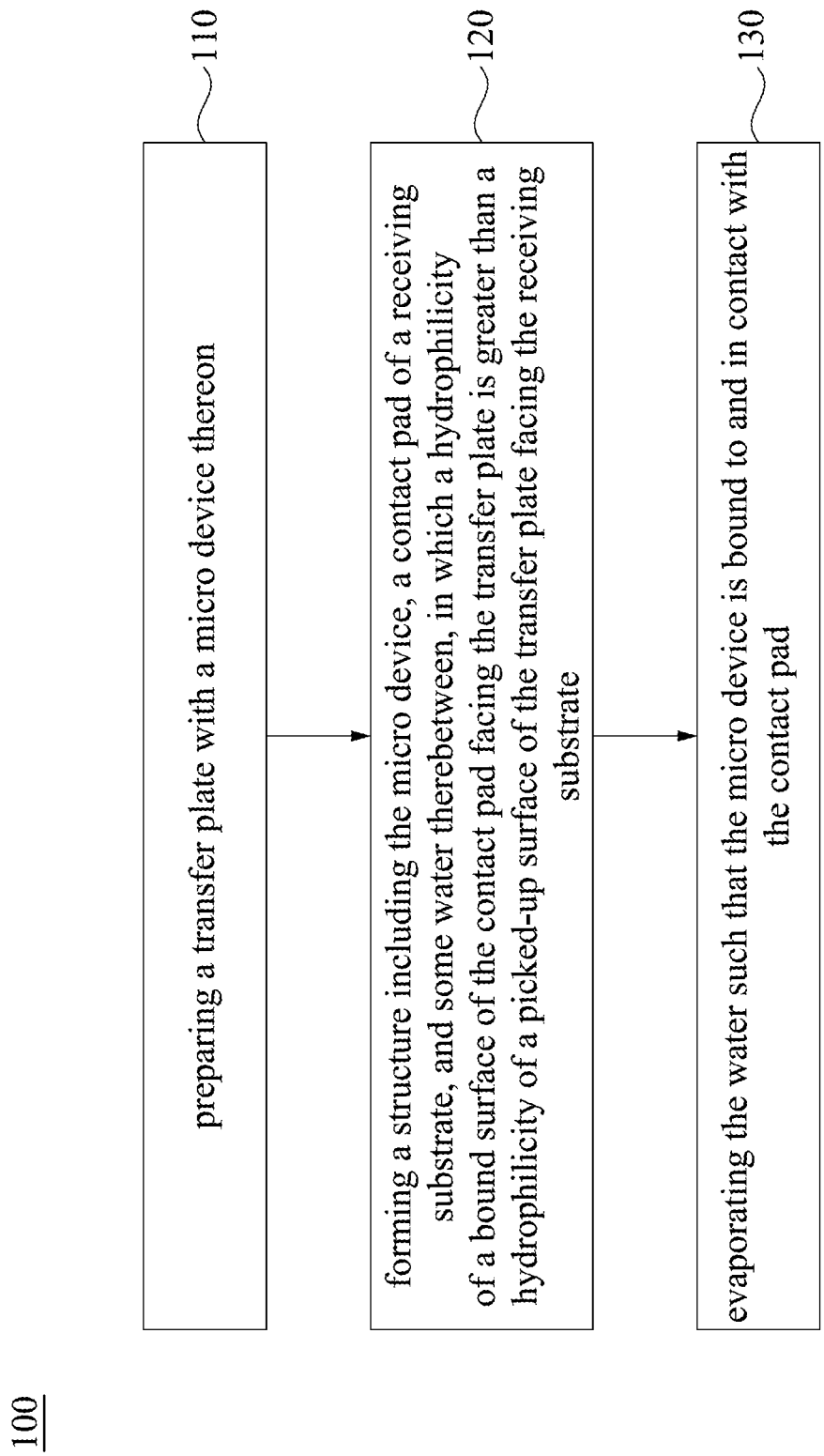
FIG. 1 is a flow chart of a method for transferring a micro device according to some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

In various embodiments, the description is made with reference to figures. However, certain embodiments may be practiced without one or more of these specific details, or in combination with other known methods and configurations. In the following description, numerous specific details are set forth, such as specific configurations, dimensions, and processes, etc., in order to provide a thorough understanding of the present disclosure. In other instances, well-known semiconductor processes and manufacturing techniques have not been described in particular detail in order to not unnecessarily obscure the present disclosure. Reference throughout this specification to "one embodiment," "an embodiment" or the like means that a particular feature, structure, configuration, or characteristic described in connection with the embodiment is included in at least one embodiment of the disclosure. Thus, the appearances of the phrase "in one embodiment," "in an embodiment" or the like in various places throughout this specification are not necessarily referring to the same embodiment of the disclosure. Furthermore, the particular features, structures, configurations, or characteristics may be combined in any suitable manner in one or more embodiments.

The terms "over," "to," "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

Figure 2A:
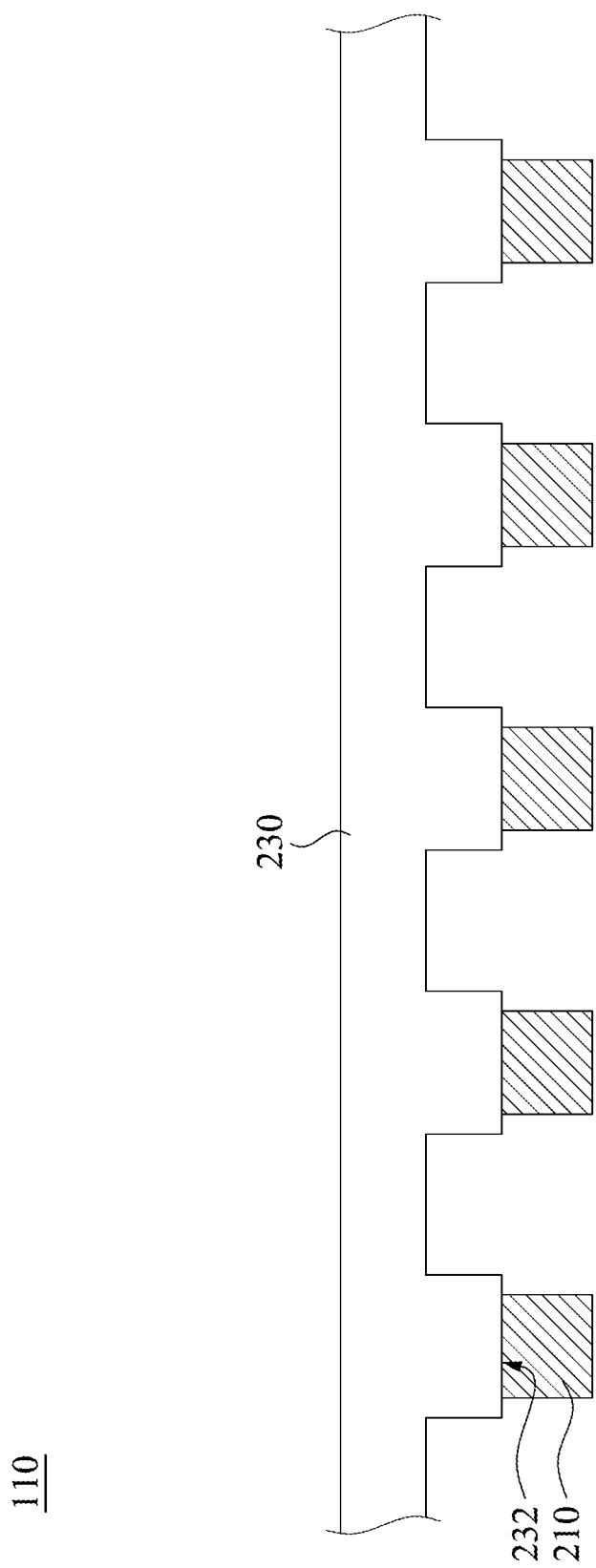
FIG. 2A is a schematic cross-sectional view of an intermediate stage of the method illustrated by FIG. 1 according to some embodiments of the present disclosure.
Figure 2B:
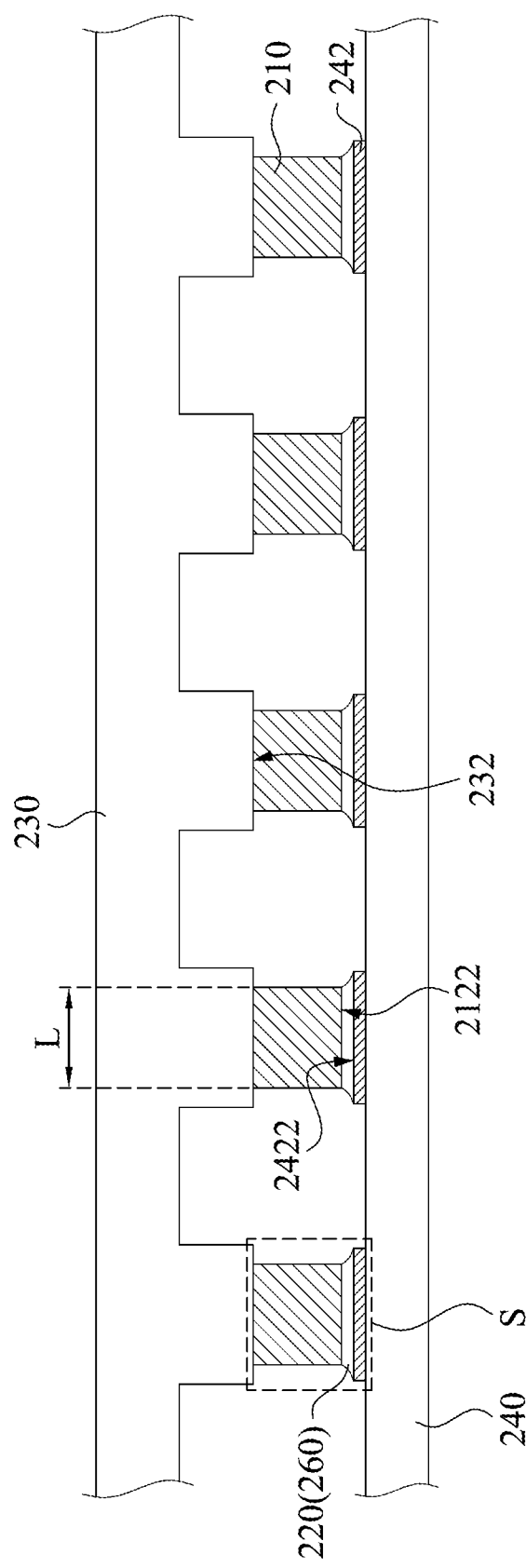
FIG. 2B is a schematic cross-sectional view of an intermediate stage of the method illustrated by FIG. 1 according to some embodiments of the present disclosure.
Figure 2C:
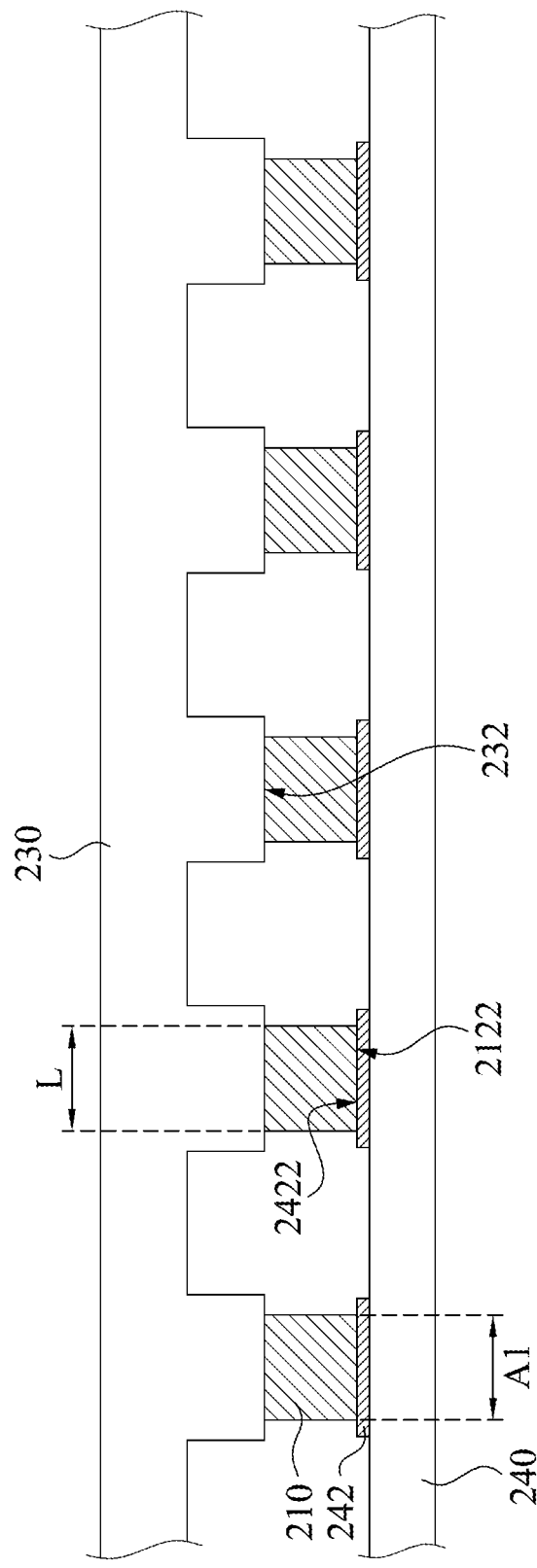
FIG. 2C is a schematic cross-sectional view of an intermediate stage of the method illustrated by FIG. 1 according to some embodiments of the present disclosure.
Figure 2C:
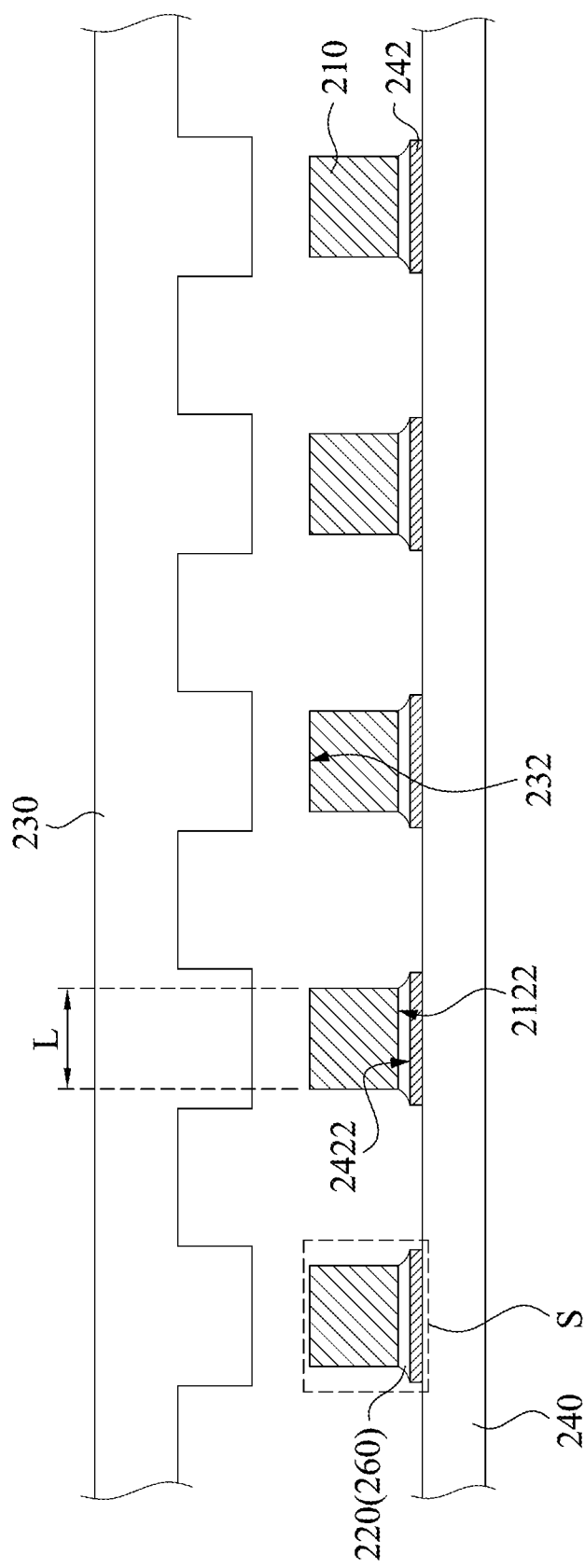
Figure 2D:
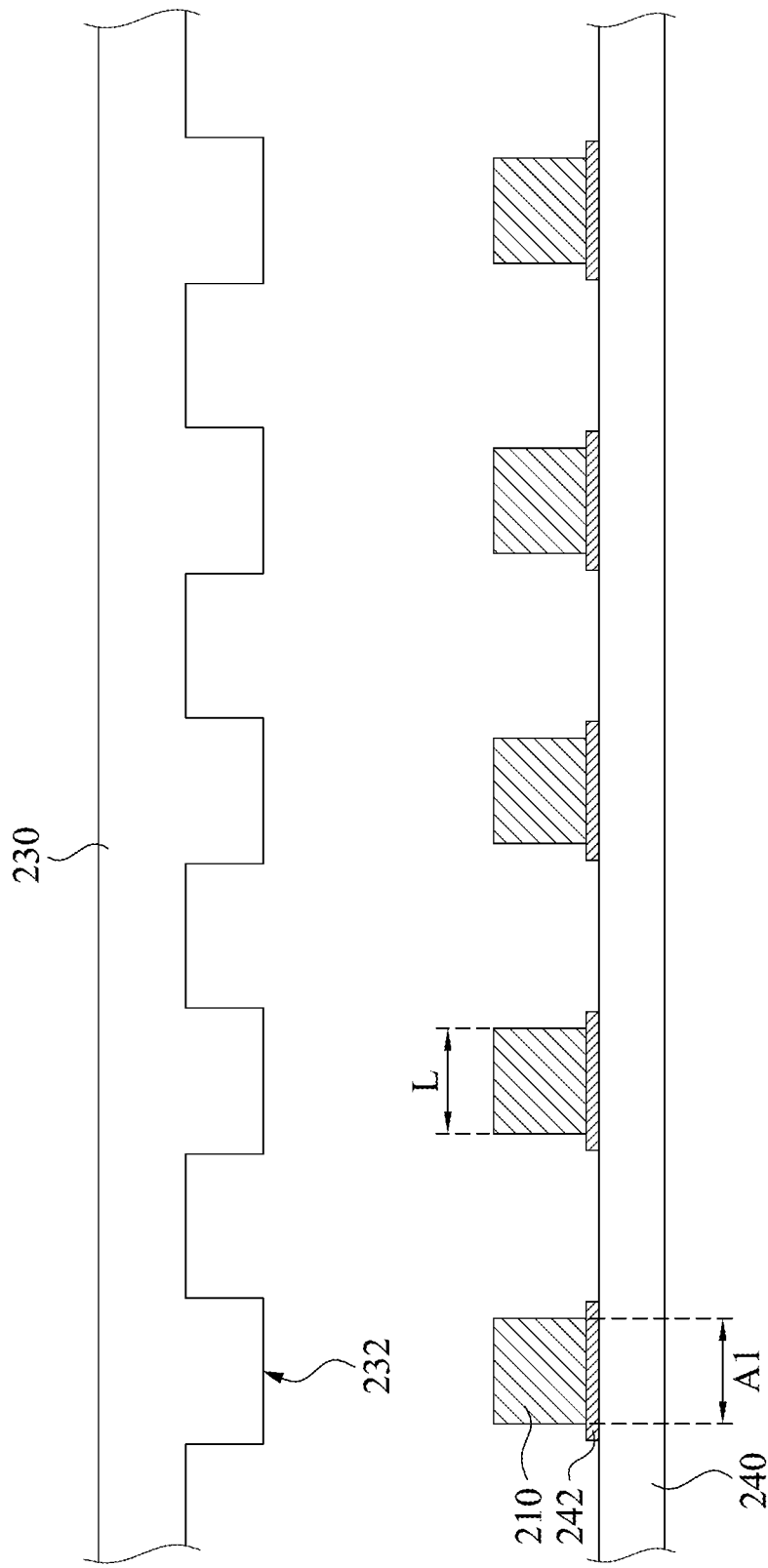
FIG. 2D is a schematic cross-sectional view of an intermediate stage of the method for transferring the micro device according to some embodiments of the present disclosure.
Figure 3:
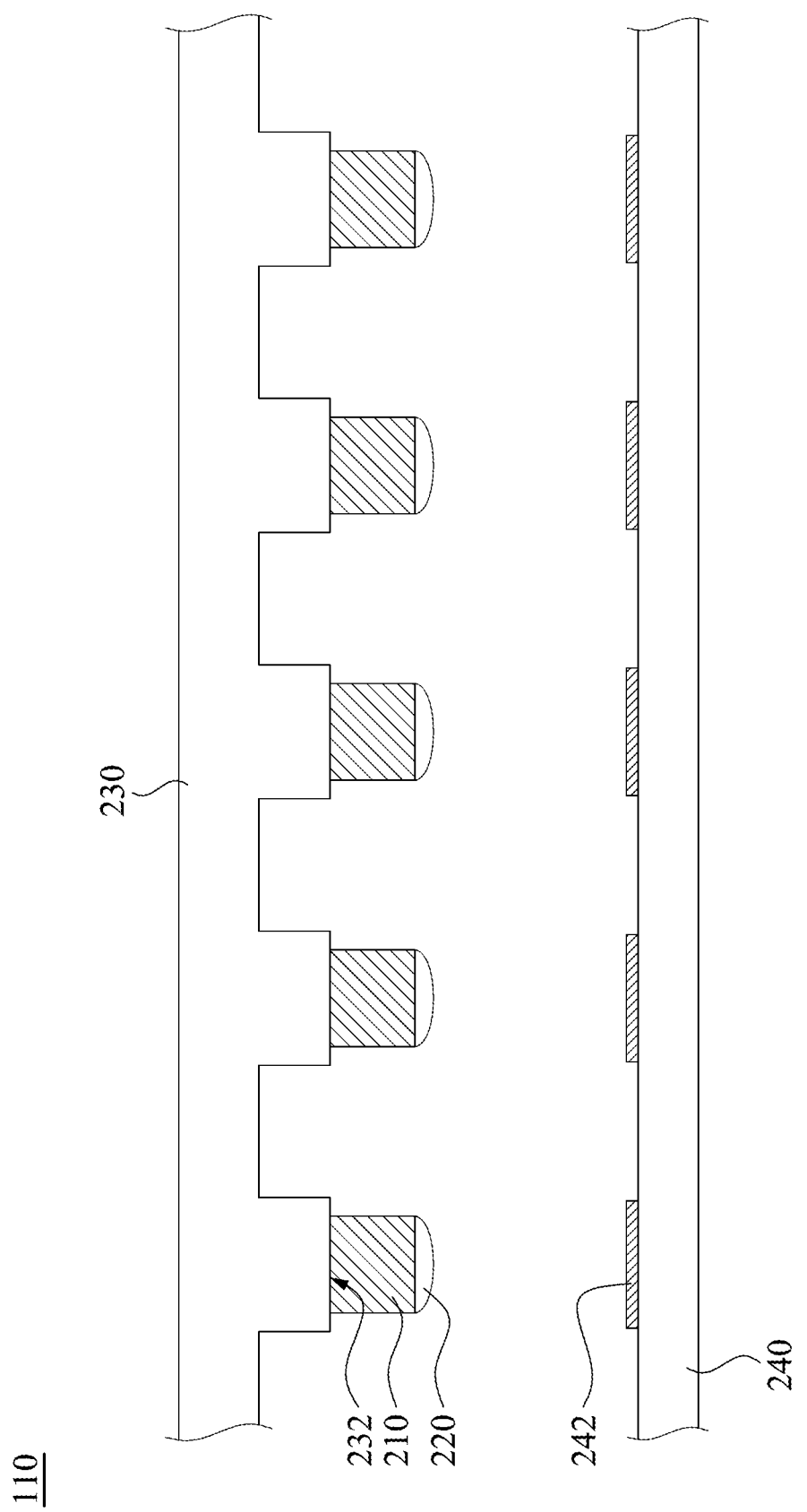
FIG. 3 is a schematic cross-sectional view of an optional intermediate stage of the method illustrated by FIG. 1 according to some embodiments of the present disclosure.

Reference is made to FIGS. 1 and 2A to 2C'. FIG. 1 is a flow chart of a method 100 for transferring a micro device 210 according to some embodiments of the present disclosure. FIGS. 2A to 2C' are schematic cross-sectional views of intermediate stages of the method 100 illustrated by FIG. 1 according to some embodiments of the present disclosure. FIG. 2D is a schematic cross-sectional view of an intermediate stage of the method 100 illustrated by FIG. 1 according to some embodiments of the present disclosure. The method 100 begins with operation 110 in which a transfer plate 230 with the micro device 210 thereon is prepared in which the micro device 210 is in contact with a picked-up surface 232 of the transfer plate 230 (as referred to FIG. 2A). The method 100 continues with operation 120 in which a structure S including the micro device 210, a contact pad 242 of a receiving substrate 240, and some water 220 therebetween is formed in which two opposite surfaces of the water 220 are respectively in contact with the micro device 210 and a bound surface 2422 of the contact pad 242 (as referred to FIG. 2B). The method 100 continues with operation 130 in which the water 220 is evaporated such that the micro device 210 is bound to and in contact with the contact pad 242 (as referred to FIGS. 2C and 2D). In some embodiments, the micro device 210 is detached from the transfer plate 230 (see FIG. 2D) after the water 220 is evaporated (see FIG. 2C). In some embodiments, the micro device 210 is detached from the transfer plate 230 (see FIG. 2C') before the water 220 is evaporated (see FIG. 2D). Briefly, in some embodiments, a sequence of operations can be from FIG. 2A to FIG. 2B and to FIG. 2C, then to FIG. 2D. In some other embodiments, a sequence of operations can be from FIG. 2A to FIG. 2B and to FIG. 2C', then to FIG. 2D.

Although in the previous paragraph only "a" micro device 210 is mentioned, "multiple" micro devices 210 may be used in practical applications and is still within the scope of the present disclosure, and will not be emphasized in the disclosure.

Reference is made to FIG. 2B and FIGS. 3 to 6. FIGS. 3 to 6 are schematic cross-sectional views of optional intermediate stages of the method 100 according to some embodiments of the present disclosure. Embodiments respectively illustrated by FIGS. 3 to 6 can be independently performed or performed in combinations. In some embodiments, a temperature of the transfer plate 230 in an environment including a vapor is lowered such that at least a portion of the vapor is condensed to form the water 220 on the micro device 210 (see FIG. 3), and then the micro device 210 is placed over the receiving substrate 240 such that the water 220 is between the micro device 210 and the contact pad 242 of the receiving substrate 240. In some embodiments, the water 220 is formed at a temperature about the dew point.

Figure 4:
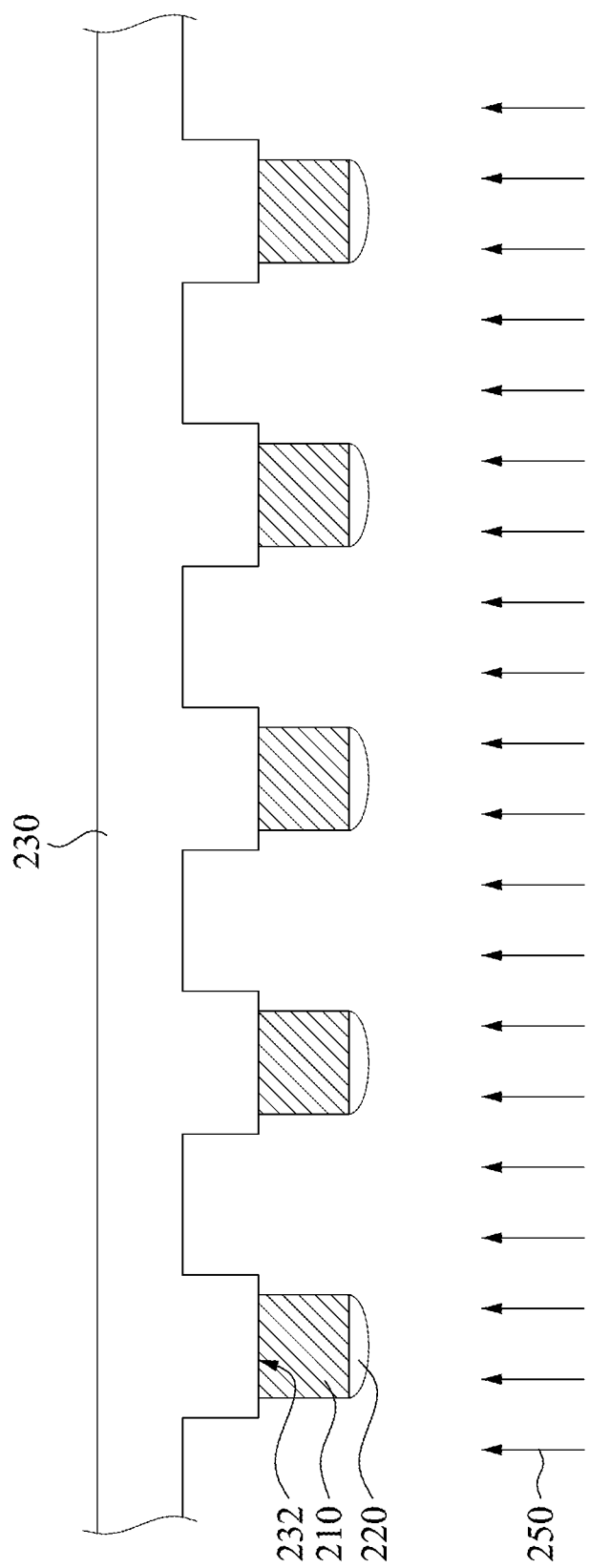
FIG. 4 is a schematic cross-sectional view of an optional intermediate stage of the method illustrated by FIG. 1 according to some embodiments of the present disclosure.

In some embodiments, a vapor 250 is showered on the micro device 210 such that at least a portion of the vapor 250 is condensed to form the water 220 (see FIG. 4). The water 220 is also allowed to be formed on the transfer plate 230 in some embodiments. In some embodiments, the vapor 250 has a water vapor pressure higher than an ambient water vapor pressure. With the above conditions, the vapor 250 is more likely to condense on the micro device 210 when the showering is performed. In some embodiments, the vapor 250 consists essentially of nitrogen and water.

Figure 5:
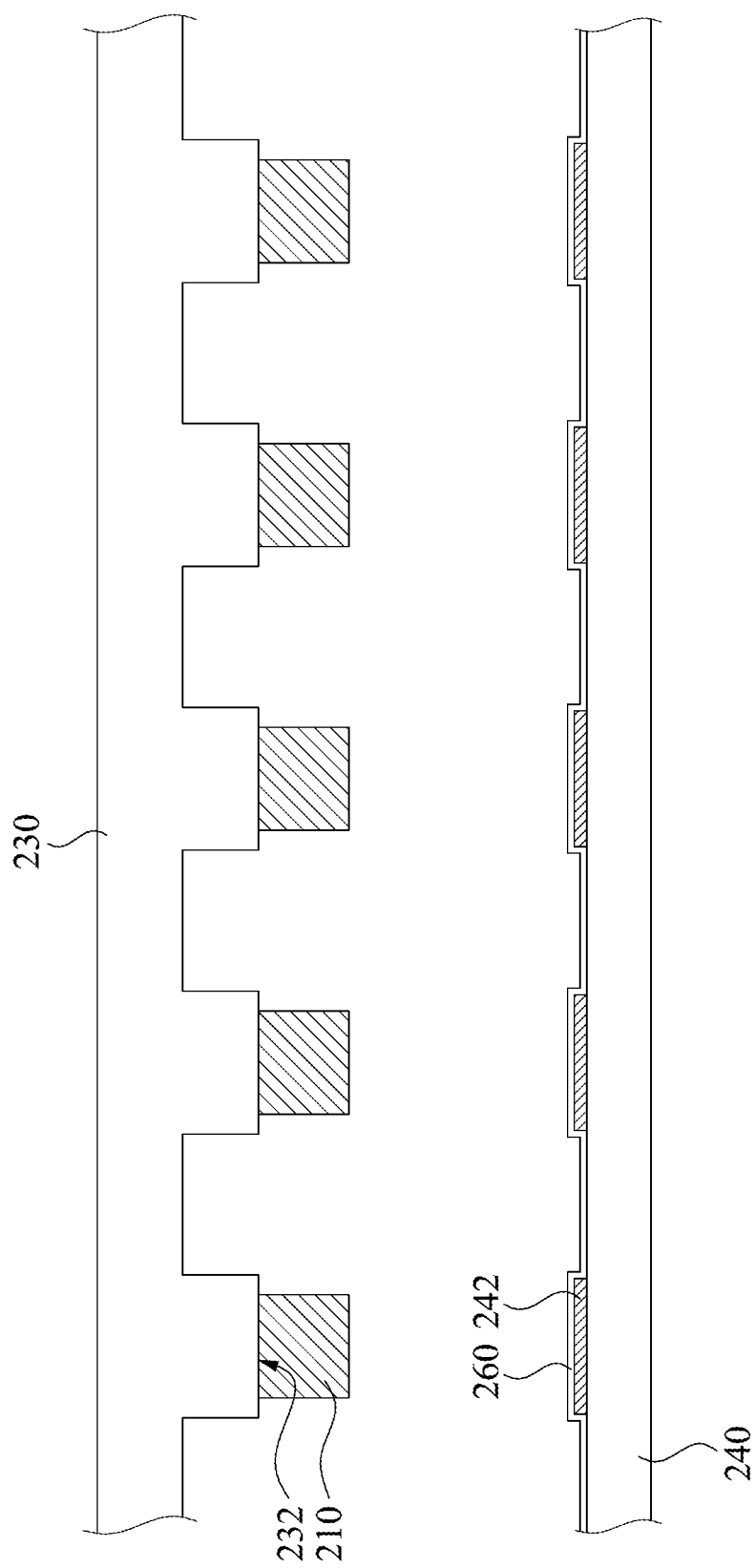
FIG. 5 is a schematic cross-sectional view of an optional intermediate stage of the method illustrated by FIG. 1 according to some embodiments of the present disclosure.
Figure 6:
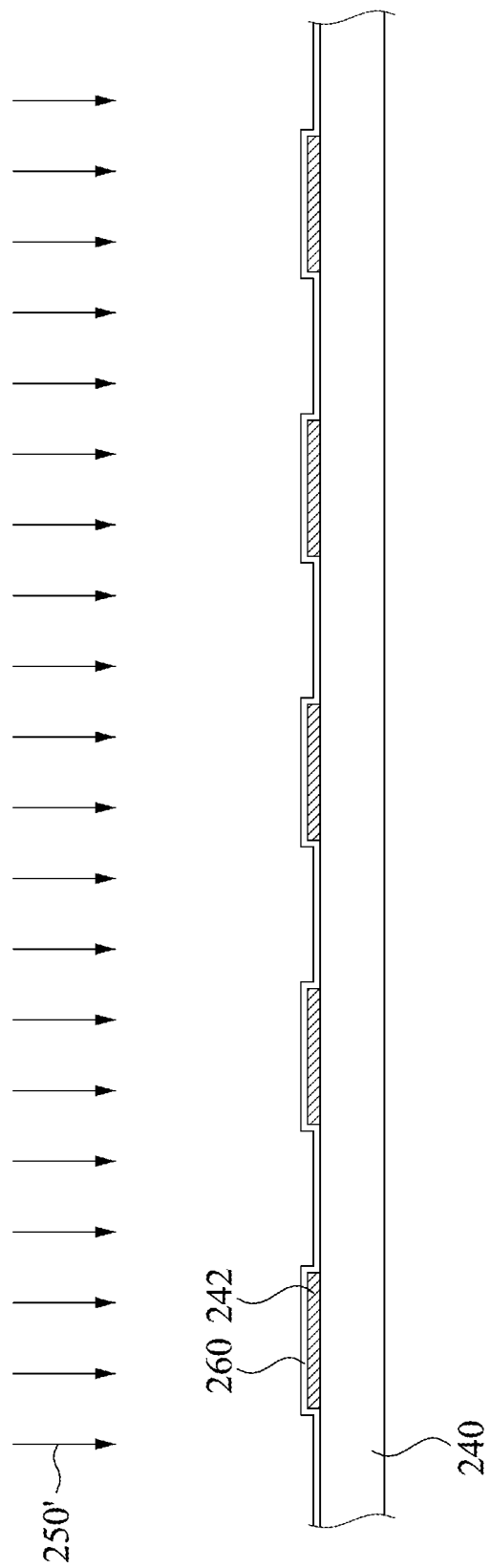
FIG. 6 is a schematic cross-sectional view of an optional intermediate stage of the method illustrated by FIG. 1 according to some embodiments of the present disclosure.

In some embodiments, some water 260 is formed on the contact pad 242 of the receiving substrate 240 before placing the micro device 210 (see FIG. 5). Although the water 260 is continuously distributed and covering the receiving substrate 240 and the contact pad 242 as shown in FIG. 5, the water 260 can also be discontinuously distributed on the receiving substrate 240, such as an island-like water (not shown in figures) covering the contact pad 242. In some embodiments, a temperature of the receiving substrate 240 is lowered in an environment including a vapor (not shown) such that at least a portion of the vapor is condensed to form the water 260. In some embodiments, a vapor 250' is showered on the contact pad 242 such that at least a portion of the vapor 250' is condensed to form the water 260 (see FIG. 6). The water 260 is also allowed to be formed on the receiving substrate 240 in some embodiments. In some embodiments, the vapor 250' has a water vapor pressure higher than an ambient water vapor pressure. With the above conditions, the vapor 250' is more likely to condense on the contact pad 242 when the showering is performed. In some embodiments, the vapor 250' consists essentially of nitrogen and water. In some other embodiments, the micro device 210 can be placed on and in contact with the contact pad 242, and then the water 260 is formed and penetrates into a space between the micro device 210 and the contact pad 242.

In some embodiments, the contact pad 242 is conductive. In some embodiments, the contact pad 242 includes one of copper and copper-rich material. The copper-rich material is a material with copper accounts for more than half of a number of atoms therein. In some embodiments, the contact pad 242 includes a bonding material. The bonding material includes titanium (Ti), tin (Sn), indium (In), or a combination thereof. One of Ti, Sn, and In accounts for more than half of a number of atoms of the bonding material. In some embodiments, a lateral length L of the micro device 210 is less than or equal to about 100 μm.

In some embodiments, the micro device 210 is placed by the transfer plate 230 via a mechanical force (e.g., an adhesive force) or an electromagnetic force (e.g., an electrostatic force or an enhanced electrostatic force generated by an alternating voltage through bipolar electrodes), but should not be limited thereto. After the water 220(260) is in contact with both the contact pad 242 and the micro device 210, the micro device 210 and the contact pad 242 are gripped together by a capillary force produced by the two opposite surfaces of the water 220(260). In some embodiments, a thickness of the water 220(260) between the micro device 210 and the contact pad 242 is smaller than a thickness of the micro device 210, such that a relative position between the micro device 210 and the contact pad 242 after the water 220(260) is evaporated can be more accurately controlled (maintained). In some embodiments, the water 220(260) is evaporated with a temperature about a boiling point of the water 220(260).

Reference is made to FIGS. 2C, 2C', and 2D. After the water 220(260) is evaporated, the micro device 210 is stuck to the receiving substrate 240. In some embodiments, the temperature of the receiving substrate 240 is lowered such that the water 220(260) is frozen before the micro device 210 is detached from the transfer plate 230. The frozen water 220(260) provides a force to grip the micro device 210, and the transfer plate 230 is then detached from the micro device 210 (e.g., see FIG. 2C'). It is noted that a hydrophilicity of the bound surface 2422 of the contact pad 242 facing the transfer plate 230 is greater than a hydrophilicity of the picked-up surface 232 of the transfer plate 230 facing the receiving substrate 240. Since some water vapor (or water) may exist between the picked-up surface 232 and the micro device 210, the above condition on the hydrophilicity can assist detaching the micro device 210 from the transfer plate 230 and sticking the micro device 210 to the contact pad 242. Specifically, the water vapor (or water) existing between the picked-up surface 232 and the micro device 210 may come from moisture in the air or penetration of the water 220. As such, a pull force between the bound surface 2422 of the contact pad 242 and the water 220(260) is greater than a pull force between the picked-up surface 232 of the transfer plate 230 and the water vapor (or the water) existed between the picked-up surface 232 and the micro device 210, so as to help transferring the micro device 210 from the transfer plate 230 to the receiving substrate 240 with said condition on the hydrophilicity.

Figure 7:
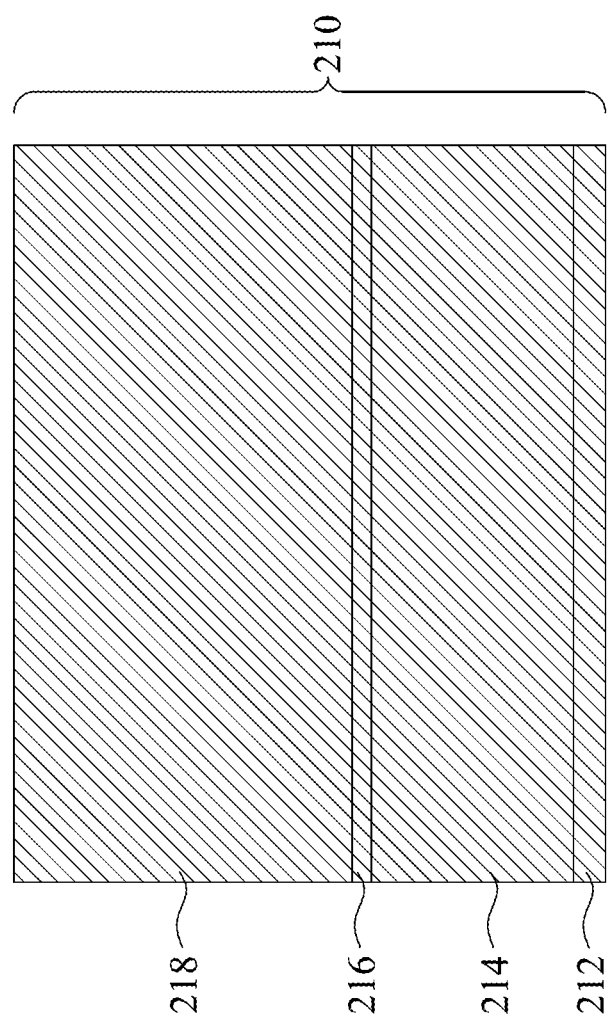
FIG. 7 is a schematic cross-sectional view of the micro device according to some embodiments of the present disclosure.

Reference is made to FIG. 7. FIG. 7 is a schematic cross-sectional view of the micro device 210 according to some embodiments of the present disclosure. In some embodiments, the micro device 210 includes an electrode 212 thereon, and the micro device 210 is bound to and in contact with the contact pad 242 via the electrode 212 after the water 220(260) is evaporated. In some embodiments, the micro device 210 includes a first type semiconductor layer 214, an active layer 216 on the first type semiconductor layer 214, and a second type semiconductor layer 218 on the active layer 216. The first type semiconductor layer 214 can be a p-type semiconductor layer, and the second type semiconductor layer 218 can be an n-type semiconductor layer, but should not be limited thereto.

In some embodiments, a combination of the micro device 210 and the receiving substrate 240 is further heated to produce a bonding force to bond the micro device 210 and the contact pad 242 together after evaporating the liquid layer 220 and before detaching the micro device 210 from the transfer plate 230. Since the bonding force is normally stronger than the water 220(260) assisted binding (force) as mentioned, the micro device 210 can be stuck to the contact pad 242 more firmly after a relative position between the micro device 210 and the contact pad 242 is within a controllable range. In some embodiments, a temperature of the contact pad 242 is further increased to be above a boiling point of the water 220 after evaporating the water 220(260) and below a eutectic point between the contact pad 242 and the electrode 212. Specifically, said "below" means a temperature point is below the eutectic point but is enough to induce a solid phase diffusion between the contact pad 242 and the electrode 212 such that the micro device 210 is "bonded" to the contact pad 242 to strengthen the solidity between the electrode 212 and the contact pad 242. In such embodiments, the micro device 210 can be better protected (i.e., free from damage during the bonding process) due to a lower temperature bonding process.

In some embodiments, the temperature of the contact pad 242 is further increased to be above a eutectic point between the contact pad 242 and the electrode 212 after evaporating the water 220(260). In some embodiments, the temperature of the contact pad 242 is increased to a temperature point such that a solid phase diffusion occurs to bond the electrode 212 to the contact pad 242. In some embodiments, a thickness of the electrode 212 ranges from about 0.2 μm to about 2 μm to satisfy a balance between the criterion for the solid phase diffusion to occur and a trend to decrease a size of the micro device 210. In some embodiments, the electrode 212 includes a bonding material. The bonding material includes one of tin, indium, titanium, and a combination thereof. One of tin, indium, and titanium accounts for more than half of a number of atoms of the bonding material. In some embodiments, the electrode 212 includes one of copper and copper-rich material. The copper-rich material is a material with copper accounts for more than half of a number of atoms therein.

In some embodiments, a contact area A1 between the electrode 212 and the contact pad 242 is smaller than or equal to about 1 square millimeter (mm$^2$). The limitation of the size of the contact area A1 as mentioned is to support the capillary force to pull a surface 2122 (see FIG. 2B) of the electrode 212 facing the contact pad 242 and a bound surface 2422 of the contact pad 242 facing the electrode 212 together and to assist the formation of the solid phase bonding after the water 220 is evaporated.

The structural integrity (solidity) between the electrode 212 and the contact pad 242 after the binding is strong enough to hold the micro device 210 in position and form the contact between the electrode 212 and the contact pad 242. It is also noted that the "water 220(260) assisted bonding" is preferably effective when a lateral length L of the micro device 210 is smaller than or equal to about 100 μm since a smaller lateral length L of the micro device 210 results in a higher ratio between a length of a periphery of a contact region and an area of the contact region (i.e., the contact area A1), which facilitates the influence of the capillary force and thus the formation of binding. Also, it is preferable for the contact area A1 as mentioned for one micro device 210 to be smaller than or equal to about 1 mm$^2$. If the contact area A1 is too large, an influence of the capillary force will be too small to pull the surface 2122 of the electrode 212 and the bound surface 2422 of the contact pad 242 together to an extent enough to assist the formation of the solid phase bonding after the water 220 is evaporated. Given the foregoing explanation, in some auxiliary embodiments, the electrode 212 is a patterned electrode including at least two isolated portions isolated from one another, so as to increase the ratio between the length of a periphery of a contact region and an area of the contact region.

Figure 8:
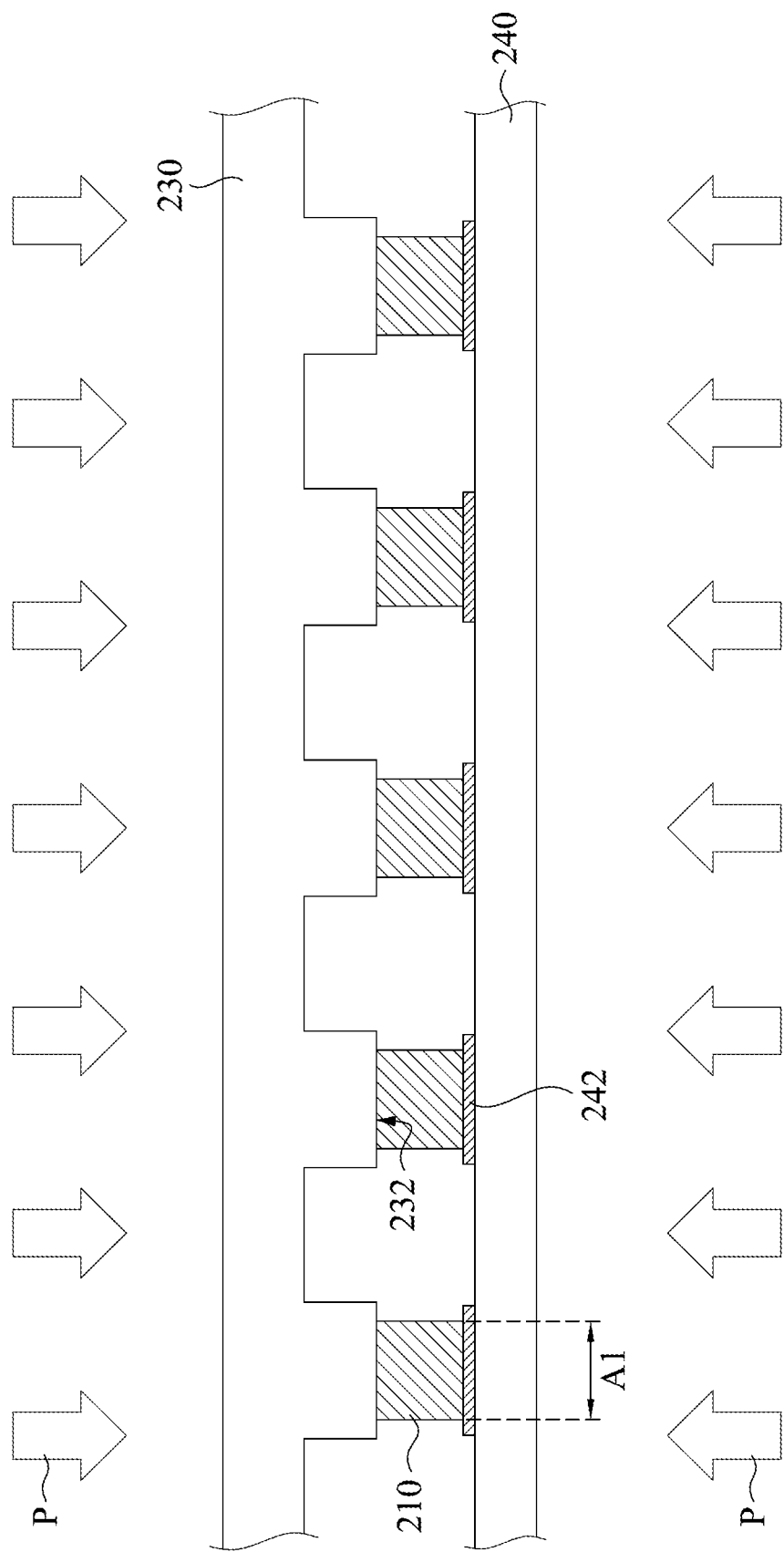
FIG. 8 is a schematic cross-sectional view of an optional intermediate stage of the method illustrated by FIG. 1 according to some embodiments of the present disclosure.

Reference is made to FIG. 8. FIG. 8 is a schematic cross-sectional view of an optional intermediate stage of the method 100 according to some embodiments of the present disclosure. In some embodiments, an external pressure P is applied to press the micro device 210 and the contact pad 242 during evaporating the water 220(260) to further assist contacting the electrode 212 to the contact pad 242 for a better solid phase bonding therebetween to occur. The external pressure P can be produced and applied on the micro device 210 by pressing the transfer plate 230 toward the micro device 210 (e.g., placing an object). In some embodiments, the object is an additional plate with a size (e.g., an area) equal to or greater than a size (e.g., an area) of the transfer plate 230. The additional plate as mentioned can produce a more uniform external pressure P on the micro device 210 compared to the object with random shapes and sizes. In some embodiments, the external pressure P can be produced and applied on the micro device 210 by changing the environmental pressure to press the micro device 210 and the contact pad 242, but should not be limited thereto.

In summary, embodiments of the present disclosure provide a method for transferring a micro device in which a hydrophilicity of a bound surface of a contact pad facing a transfer plate is greater than a hydrophilicity of a picked-up surface of the transfer plate facing a receiving substrate, so as to assist detaching the micro device from the transfer plate and sticking the micro device to the contact pad of the receiving substrate.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the method and the structure of the present disclosure without departing from the scope or spirit of the disclosure. In view of the foregoing, it is intended that the present disclosure cover modifications and variations of this disclosure provided they fall within the scope of the following claims.

What is claimed is:

1. A method for transferring a micro device, comprising:
preparing a transfer plate with the micro device thereon, wherein the micro device is in contact with a picked-up surface of the transfer plate;
forming a structure comprising the micro device, a contact pad of a receiving substrate, and some water therebetween, two opposite surfaces of the water being respectively in contact with the micro device and a bound surface of the contact pad, wherein a hydrophilicity of the bound surface of the contact pad facing the transfer plate is greater than a hydrophilicity of the picked-up surface of the transfer plate facing the receiving substrate; and
evaporating the water such that the micro device is bound to and in contact with the contact pad.

2. The method of claim 1, wherein forming the structure comprises:
forming the water on at least one of the micro device and the contact pad; and
placing the micro device over the receiving substrate such that the water is between the micro device and the contact pad of the receiving substrate.

3. The method of claim 2, wherein forming the water comprises:
showering a vapor on at least one of the micro device and the contact pad such that at least a portion of the vapor is condensed to form the water.

4. The method of claim 3, wherein the vapor has a water vapor pressure higher than an ambient water vapor pressure.

5. The method of claim 3, wherein the vapor consists essentially of nitrogen and water.

6. The method of claim 2, wherein the water is formed at a temperature about the dew point.

7. The method of claim 2, wherein forming the water comprises:
lowering a temperature of the transfer plate in an environment comprising a vapor such that at least a portion of the vapor is condensed to form the water.

8. The method of claim 1, further comprising:
applying an external pressure to press the micro device and the contact pad during evaporating the water.

9. The method of claim 1, further comprising:
detaching the micro device from the transfer plate and the micro device is stuck to the receiving substrate before evaporating the water.

10. The method of claim 9, further comprising:
lowering a temperature of the receiving substrate such that the water is frozen before detaching the micro device from the transfer plate.

11. The method of claim 1, further comprising:
detaching the micro device from the transfer plate and the micro device is stuck to the receiving substrate after evaporating the water.

12. The method of claim 11, further comprising:
heating a combination of the micro device and the receiving substrate to produce a bonding force to bond the micro device and the contact pad together before detaching the micro device from the transfer plate.

13. The method of claim 1, wherein a lateral length of the micro device is less than or equal to about 100 μm.

14. The method of claim 1, wherein the micro device comprises an electrode thereon, the micro device is bound to and in contact with the contact pad via the electrode, and a contact area between the electrode and the contact pad is smaller than or equal to about 1 square millimeter.

15. The method of claim 14, further comprising:
increasing a temperature of the contact pad to be above a boiling point of the water and below a eutectic point between the contact pad and the electrode after evaporating the water.

* * * * *